(12) United States Patent (10) Patent No.: US 12,683,619 B2
Zhong et al. (45) Date of Patent: Jul. 14, 2026

(54) NOISE-SHAPING SAR ADC WITH PASSIVE-ACTIVE HYBRID GAIN

(71) Applicant: QUALCOMM Incorporated, San Diego, CA (US)

(72) Inventors: Xiaopeng Zhong, Seattle, WA (US); Yuhua Guo, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 193 days.

(21) Appl. No.: 18/440,825

(22) Filed: Feb. 13, 2024

(65) Prior Publication Data

US 2025/0260411 A1 Aug. 14, 2025

(51) Int. Cl.
H03M 1/12 (2006.01)
H03M 1/06 (2006.01)
H03M 1/08 (2006.01)

(52) U.S. Cl.
CPC ........... H03M 1/08 (2013.01); H03M 1/0604 (2013.01)

(58) Field of Classification Search
CPC .... H03M 1/0854; H03M 1/1245; H03M 3/34; H03M 3/43; H03M 3/458; H03M 1/0626; H03M 1/468; H03M 3/426; H03M 1/462; H03M 1/466; H03M 1/46; H03M 3/464; H03M 3/47; H03M 1/08; H03M 1/38; H03M 3/342; H03M 3/424; H03M 3/454; H03M 1/0607; H03M 1/145; H03M 1/442; H03M 3/438; H03M 3/452; H03M 1/14; H03M 1/201; H03M 1/662; H03M 3/356; H03M 3/39; H03M 3/456; H03M 3/46; H03M 3/496; H03M 1/002; H03M 1/0604; H03M 1/0609; H03M 1/0617;
(Continued)

(56) References Cited

U.S. PATENT DOCUMENTS

| | | | |
|---|---|---|---|
| 6,204,787 B1 * | 3/2001 | Baird | H03M 3/488 |
| | | | 341/139 |
| 7,038,532 B1 * | 5/2006 | Bocko | G06G 7/186 |
| | | | 327/554 |

(Continued)

FOREIGN PATENT DOCUMENTS

| | | | | |
|---|---|---|---|---|
| CN | 111711452 A | * | 9/2020 | H03M 1/38 |

OTHER PUBLICATIONS

Zou X., et al., "Fully Passive Noise-Shaping Successive Approximation Register Analog-to-Digital Converter Realizing 2 X gain without Capacitor Stacking", Electronics Letters, The Institution of Engineering and Technology, GB, vol. 59, No. 6, Mar. 15, 2023, pp. 1-2, XP006118075, Title page 1. (Year: 2023).*

(Continued)

*Primary Examiner* — Linh V Nguyen

(74) *Attorney, Agent, or Firm* — Loza & Loza, LLP

(57) ABSTRACT

The noise-shaping successive-approximation-register analog-to-digital converter includes a capacitive digital-to-analog-converter, a loop filter including a plurality of integration capacitors, and a multi-input comparator. During an integration phase, the capacitive digital-to-analog converter couples to the plurality of integration capacitors to develop an integration voltage. The integration capacitors are then arranged to passively apply a first gain to the integration voltage. The multi-input comparator also provides a second gain to the integration voltage.

18 Claims, 11 Drawing Sheets

(58) Field of Classification Search

CPC ............. H03M 1/0641; H03M 1/0665; H03M 1/0668; H03M 1/0673; H03M 1/0863; H03M 1/1023; H03M 1/1061; H03M 1/121; H03M 1/1215; H03M 1/129; H03M 1/1295; H03M 1/144; H03M 1/365; H03M 1/403; H03M 1/42; H03M 1/44; H03M 1/60; H03M 1/667; H03M 1/72; H03M 1/802; H03M 3/02; H03M 3/32; H03M 3/322; H03M 3/332; H03M 3/338; H03M 3/35; H03M 3/374; H03M 3/402; H03M 3/406; H03M 3/41; H03M 3/414; H03M 3/416; H03M 3/422; H03M 3/428; H03M 3/436; H03M 3/446; H03M 3/448; H03M 3/488; H03M 3/492

USPC ................. 341/155, 161, 172, 118, 120, 143

See application file for complete search history.

(56) References Cited

U.S. PATENT DOCUMENTS

| | | | | |
|---|---|---|---|---|
| 7,136,006 | B2 * | 11/2006 | Koh | H03M 3/47 341/172 |
| 7,564,389 | B1 * | 7/2009 | Byrd | H03M 3/39 341/143 |
| 7,880,653 | B2 * | 2/2011 | Hong | H03M 3/464 341/143 |
| 9,136,867 | B2 * | 9/2015 | Watanabe | H03M 3/422 |
| 9,391,628 | B1 * | 7/2016 | Lyden | H03M 1/1245 |
| 9,455,733 | B1 * | 9/2016 | Wu | H03M 1/0609 |
| 9,800,262 | B1 * | 10/2017 | Maurino | H03M 1/08 |
| 2023/0208435 | A1 * | 6/2023 | Makinwa | H03M 3/322 341/143 |
| 2023/0291413 | A1 * | 9/2023 | Park | H03M 1/38 |

OTHER PUBLICATIONS

Zou X., et al., "Fully Passive Noise-Shaping Successive Approximation Register Analog-to-Digital Converter Realizing 2 X gain without Capacitor Stacking", Electronics Letters, The Institution of Engineering and Technology, GB, vol. 59, No. 6, Mar. 15, 2023. (Year: 2023).*

International Search Report and Written Opinion—PCT/US2025/012171—ISA/EPO—May 20, 2025.

Liu J., et al., "A 90-dB-SNDR Calibration-Free Fully Passive Noise-Shaping SAR ADC With 4x Passive Gain and Second-Order DAC Mismatch Error Shaping", IEEE Journal of Solid-state Circuits, IEEE, USA, vol. 56, No. 11, Jun. 18, 2021, pp. 3412-3423, Nov. 2021, XP011884990.

Wang H., et al., "A Second-Order Passive Noise-Shaping SAR ADC With 4x Passive Gain and a Two-Input-Pair Comparator", 2022 IEEE International Symposium on Circuits and Systems (ISCAS), IEEE, May 27, 2022, pp. 1134-1135, XP034224108, Title, p. 1134, left-hand column paragraph 3, figure 1.

Zou X., et al., "Fully Passive Noise-Shaping Successive Approximation Register Analog-to-Digital Converter Realizing 2 x gain without Capacitor Stacking", Electronics Letters, The Institution of Engineering and Technology, GB, vol. 59, No. 6, Mar. 15, 2023, pp. 1-2, XP006118075, Title page 1, right-hand column, paragraph 2—p. 2, left-hand column, paragraph 1, figures 2,3.

* cited by examiner

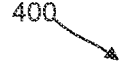
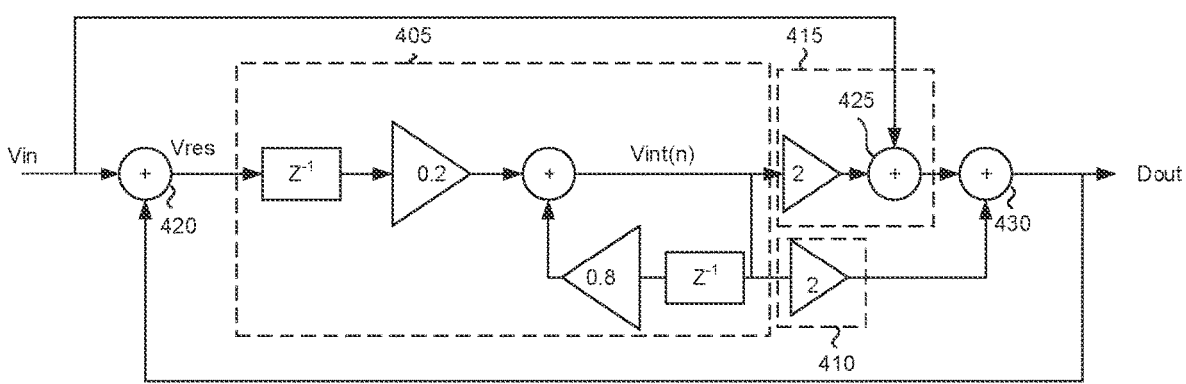
FIG. 4

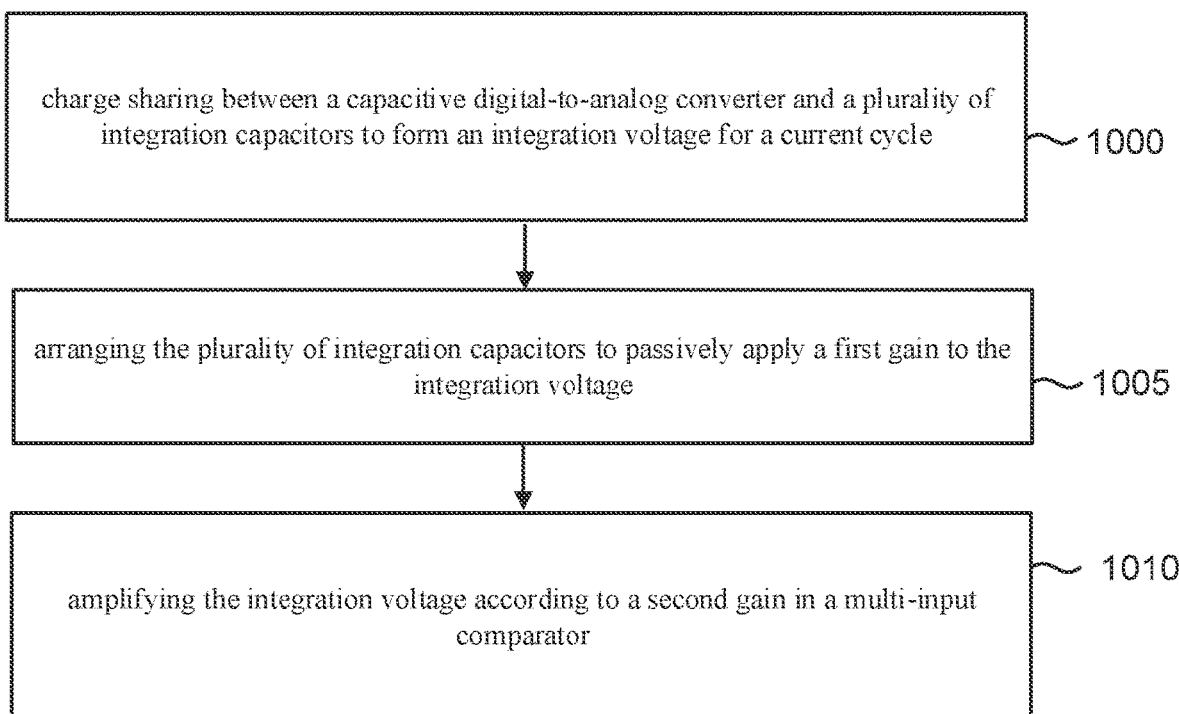

charge sharing between a capacitive digital-to-analog converter and a plurality of integration capacitors to form an integration voltage for a current cycle          ~ 1000 arranging the plurality of integration capacitors to passively apply a first gain to the integration voltage          ~ 1005 amplifying the integration voltage according to a second gain in a multi-input comparator          ~ 1010

FIG. 10

NOISE-SHAPING SAR ADC WITH PASSIVE-ACTIVE HYBRID GAIN

TECHNICAL FIELD

The present application relates generally to analog-to-digital converters, and more specifically to a noise-shaping SAR analog-to-digital converter with passive-active hybrid gain.

BACKGROUND

Noise-shaping successive-approximation-register (SAR) analog-to-digital converters (ADCs) offer high resolution yet have relatively low power consumption. An important component of a noise-shaping SAR ADC is a digital-to-analog converter (DAC) such as a capacitive DAC (CDAC) that is controlled by a SAR logic circuit during the conversion of an analog input voltage sample into a digital output signal. In this conversion, the capacitance of the CDAC is controlled according to a SAR-based search. Based upon this search, the CDAC stores an analog voltage. After the conversion of a sample, the CDAC may thus provide the residue for the sample (the difference between the sample and the analog voltage provided by the CDAC). The residue is then transferred to an integration stage that may also be denoted as a loop filter to provide an integrated voltage. In the conversion of a subsequent sample, the integrated residue voltage is summed with the subsequent sample. The development of the integration voltage is typically a determining factor of the loop filter performance.

SUMMARY

In accordance with an aspect of the disclosure, a noise-shaping successive-approximation-register analog-to-digital converter is provided that includes: a multi-input comparator including a first positive input terminal, a first negative input terminal, a second positive input terminal, and a second negative input terminal; a capacitive digital-to-analog converter having a positive output terminal and a negative output terminal; a loop filter including a first integration capacitor having a positive terminal coupled to the first positive input terminal, a second integration capacitor having a negative terminal coupled to the first negative input terminal, a third integration capacitor having a negative terminal coupled to a voltage node and a positive terminal coupled to the second positive input terminal, and a fourth integration capacitor having a positive terminal coupled to the voltage node and a negative terminal coupled to the second negative input terminal; a first stacking switch coupled between the positive output terminal and a negative terminal of the first integration capacitor; and a second stacking switch coupled between the negative output terminal and a positive terminal of the second integration capacitor, wherein the first stacking switch and the second stacking switch are each configured to close during a conversion phase.

In accordance with another aspect of the disclosure, a method of performing hybrid gain in a noise-shaping successive-approximation-register analog-to-digital converter is provided that includes: charge sharing between a capacitive digital-to-analog converter and a plurality of integration capacitors to form an integration voltage for a current cycle; arranging the plurality of integration capacitors to passively apply a first gain to the integration voltage; and amplifying the integration voltage according to a second gain in a multi-input comparator.

Finally, in accordance with yet another aspect of the disclosure, a noise-shaping successive-approximation-register analog-to-digital converter is provided that includes: a multi-input comparator including a first positive input terminal, a first negative input terminal, a second positive input terminal, and a second negative input terminal; a capacitive digital-to-analog converter having a positive output terminal coupled to the first positive input terminal and having a negative output terminal coupled to the first negative input terminal; a loop filter including a first integration capacitor having a positive terminal coupled to the second positive input terminal and including a second integration capacitor having a negative terminal coupled to the second negative input terminal; a first stacking switch coupled between a negative terminal of the first integration capacitor and a node for a common-mode voltage and a second stacking switch coupled between a positive terminal of the second integration capacitor and the node for the common-mode voltage.

These and other advantageous features may be better appreciated through the following detailed description.

BRIEF DESCRIPTION OF THE DRAWINGS

FIG. 4 is a signal flow representation of a noise-shaping SAR ADC with adding hybrid gain in accordance with an aspect of the disclosure.

FIG. 10 is a flowchart of a method of performing hybrid gain in a noise-shaping successive-approximation-register analog-to-digital converter in accordance with an aspect of the disclosure.

Implementations of the present disclosure and their advantages are best understood by referring to the detailed description that follows. It should be appreciated that like reference numerals are used to identify like elements illustrated in one or more of the figures.

DETAILED DESCRIPTION

Figure 1A:
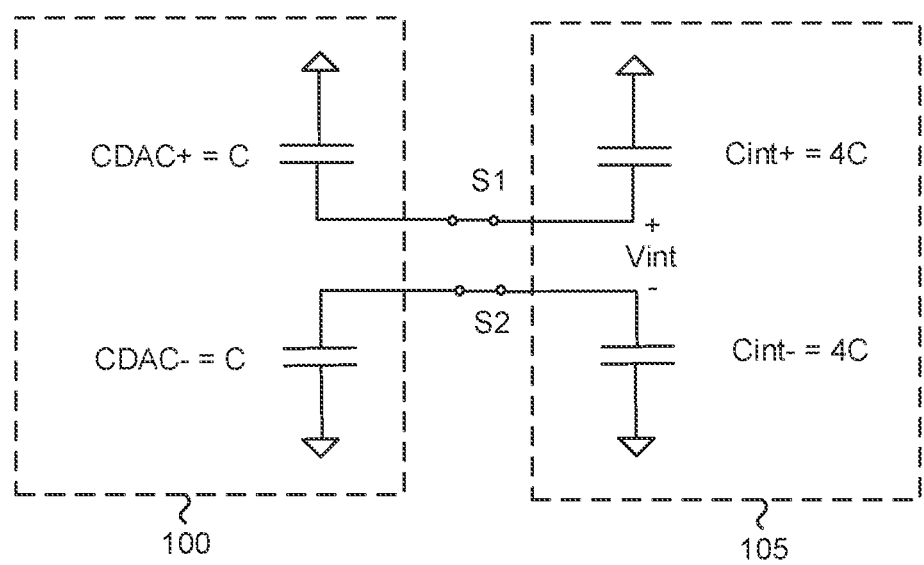
FIG. 1A is a diagram of a noise-shaping SAR ADC with traditional active gain during an integration phase.

The summation of the integrated residue with the current input sample in a noise-shaping SAR ADC is quite advantageous because the quantization noise may then be frequency shifted out of the bandwidth of interest for the signal being quantized. The integrated residue for a current ADC calculation cycle is based upon a function of the integrated residue for a preceding ADC calculation cycle and the residue for the preceding cycle as given by the following Equation (1):

$$Vint(n)=\alpha*Vint(n-1)+(1-\alpha)*Vres(n-1) \qquad \text{Eq. (1)}$$

where Vint(n) is the integrated residue for the current cycle, $\alpha$ is a proportionality constant that is less than one, Vint(n−1) is the integrated residue from the preceding cycle, and Vres(n−1) is the residue from the preceding cycle. As the proportionality constant $\alpha$ is increased towards unity, the sharper the cutoff for the noise-shaping frequency shifting of the quantization noise. However, power consumption and circuit area may increase as the proportionality constant $\alpha$ approaches unity too closely. Thus, the following discussion will assume that a equals 0.8 but it will be appreciated that the proportionality constant $\alpha$ may be greater than or less than 0.8 in alternative implementations. With the proportionality constant $\alpha$ equaling 0.8, the current differential integration voltage Vin (n) becomes equal to 0.8*Vint(n−1)+0.2*Vres(n−1).

Prior to the summation with the current input sample, the integrated residue is amplified according to a gain. Based upon this gain, it can be shown that the noise-shaping SAR ADC has a noise transfer function (NTF) in the Z domain as given by the following Equation (2):

$$NTF=(1-\alpha*Z^{-1})/\{(1+(g*(1-\alpha)-\alpha)Z^{-1}\} \qquad \text{Eq. (2)}$$

where g is the gain applied to the integrated residue. If the gain is four, the NTF simplifies to $1-0.8Z^{-1}$ so that the zero of the noise transfer function is close to the unit circle, which provides the desired sharp cutoff for the frequency shifting of the quantization noise. It will thus be assumed in the following discussion that the gain applied to the integrated residue is four, but it will be appreciated that a gain higher or lower than four may be used in alternative implementations.

A loop filter that provides the desired proportionality a and gain g is a critical component of a noise-shaping SAR ADC. During an integration stage, the loop filter forms the current integration voltage sample as discussed with respect to Eq. (1). The loop filter then amplifies the current integration voltage sample according to the gain g to provide an amplified current integration voltage sample. In a SAR conversion phase, the amplified integration voltage sample is summed with the current input voltage sample from the input signal being digitized to provide a summed signal that will be converted according to a SAR based search into the digital output signal. It may thus be seen that the loop filter has an inherent analog character and will typically dominate the power consumption of the noise-shaping SAR ADC.

To limit the power consumption of the loop filter, there are two main approaches or architectures. In a first approach, a multi-input comparator is used to provide the gain g for the loop filter. This first approach may thus be denoted as an active gain loop filter due to the gain provided by the multi-input comparator. Prior to the gain being applied by the multi-input comparator, an integration phase forms the current integration voltage sample through a passive charge sharing between the CDAC and the integration capacitors in the loop filter. For example, suppose that the CDAC develops the residue as a differential voltage such that the residue comprises a positive residue voltage and a negative residue voltage (note that this residue is always from the preceding cycle as also shown by Eq. (1)). As shown in FIG. 1A, a CDAC 100 has a total capacitance of 2*C as formed by a positive CDAC capacitor CDAC+ of capacitance C and a negative CDAC capacitor CDAC− of capacitance C that are charged by a differential residue voltage (Vres(n−1)) from the previous ADC cycle prior to the closing of a pair of transfer switches S1 and S2. The capacitance C is also denoted herein as a CDAC capacitance. Similarly, a loop filter 105 has a capacitance of 4*C as formed by a positive integration capacitor Cint+ and a negative integration capacitor Cint− that are charged by the integration voltage (Vint(n−1)) from the previous cycle. During an integration stage, the transfer switches S1 and S2 close. It can be shown that a differential integration voltage for the current cycle that is developed equals the desired value of 0.8*Vint(n−1)+0.2*Vres(n−1). For brevity, the differential integration voltage is denoted simply as an integration voltage in the following discussion.

Figure 1B:
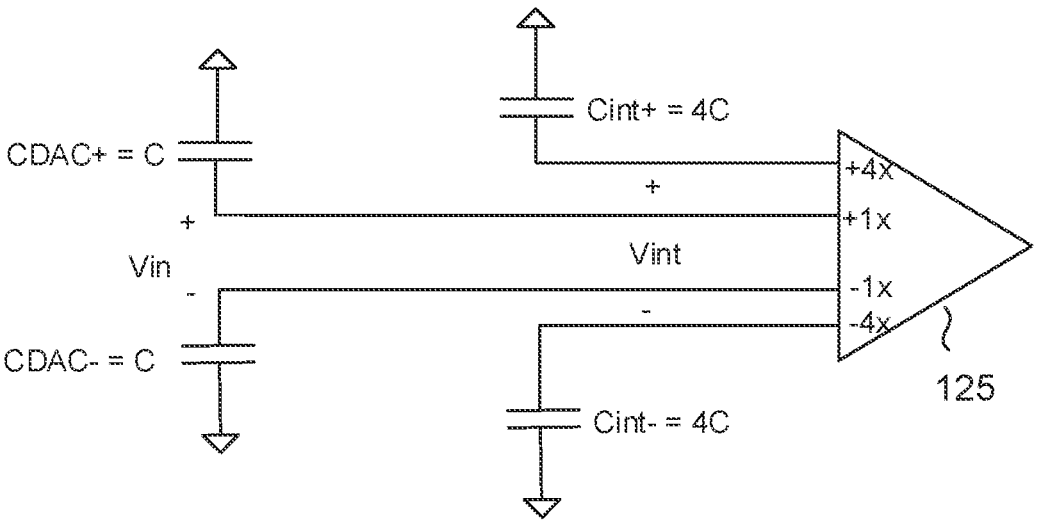
FIG. 1B is a diagram of a noise-shaping SAR ADC with traditional active gain during a SAR conversion phase.

As shown in FIG. 1B, a multi-input comparator 125 applies the desired gain of four to the differential integration voltage during a SAR-based conversion phase in which the amplified integration voltage is summed with a differential input voltage Vin. The SAR-based conversion phase is also denoted herein as simply a SAR conversion phase for brevity. The multi-input comparator 125 then compares the resulting summed signal to a reference voltage (not illustrated) during the SAR conversion phase. To apply the desired gain of four to the integration voltage, the multi-input comparator 125 includes a pair of input terminals +4x and −4x. The multi-input comparator 125 includes a corresponding differential pair of transistors (not illustrated) coupled to the +4x and −4x input terminals to apply the gain of four. A positive terminal of the positive integration capacitor Cint+ couples to the +4x input terminal of the multi-input comparator 125. Similarly, a negative terminal of the negative integration capacitor Cint− couples to the −4x input terminal of the multi-input comparator 125. A positive terminal of the positive CDAC capacitor CDAC+ couples to a +1x input terminal of the multi-input comparator 125. Similarly, a negative terminal of the negative CDAC capacitor CDAC− couples to a −1x input terminal of the multi-input comparator 125. As compared to the differential pair of transistors coupled to the +4x and −4x input terminals, the multi-input comparator 125 includes a smaller differential pair of transistors (not illustrated) coupled to the +1x and −1x input terminals to apply the unity gain. In the SAR conversion phase, the CDAC 100 is charged with the differential input voltage Vin. The differential input voltage Vin is also denoted herein as simply an input voltage Vin for brevity. As compared to the input voltage Vin received at the first pair of input terminals +1x and −1x, multi-input comparator 125 applies four times the gain to the integration voltage received at the second pair of input terminals +4x and −4x. Multi-input comparator 125 thus forms a summation signal of Vin+4*Vint that is compared to a reference voltage by switching the capacitance of the CDAC during the SAR conversion stage to achieve the desired NTF of $1-0.8Z^{-1}$ as discussed regarding Eq. (2).

Although the active gain approach discussed regarding FIGS. 1A and 1B achieves the desired NTF, note that the total capacitance of the CDAC 100 and the loop filter 105 is 10*C. Implementing such a relatively large capacitance through the patterning of metal layers adjacent a semiconductor die to form the corresponding capacitors may take an excessive amount of die space. Moreover, the relatively large gain of the multi-input comparator 125 results in a relatively large comparator input referred noise and demands a relatively large amount of semiconductor die space for its implementation. In addition, the power consumption of the multi-input comparator 125 may be too large.

Figure 2A:
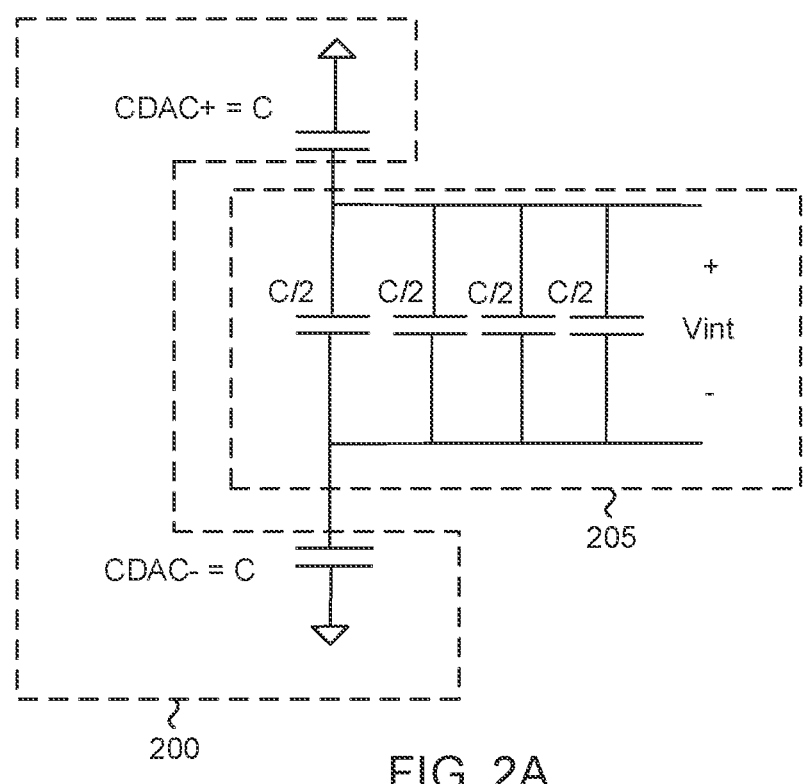
FIG. 2A is a diagram of a noise-shaping SAR ADC with traditional passive gain during an integration phase.

To avoid the input referred noise, die space demand, and power consumption of an active-gain loop filter, a passive capacitor-stacking loop filter approach has been developed. As shown in FIG. 2A, a CDAC 200 has a total capacitance of 2*C as formed by a positive CDAC capacitor CDAC+ of capacitance C and a negative CDAC capacitor CDAC− of capacitance C that are charged by a residue voltage (Vres (n−1)) from the previous ADC cycle prior to the closing of a pair of transfer switches (not illustrated). Similarly, a loop filter 205 has a total capacitance of 2*C as formed by four integration capacitors arranged in parallel. Each integration capacitor has a capacitance of C/2. During an integration phase, the transfer switches close. It can be shown that a differential integration voltage for the current cycle that is developed equals the desired value of 0.8*Vint(n−1)+ 0.2*Vres(n−1).

Figure 2B:
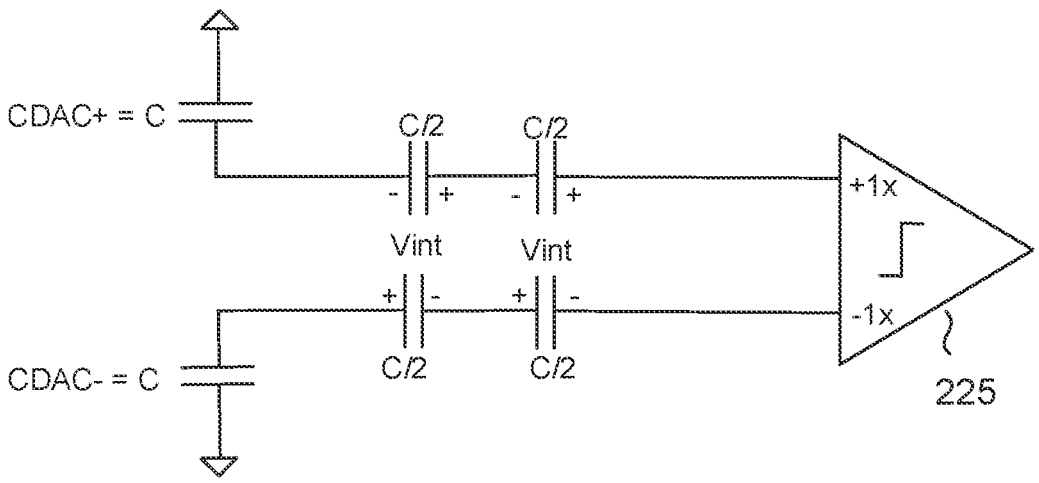
FIG. 2B is a diagram of a noise-shaping SAR ADC with traditional passive gain during a SAR conversion phase.

To amplify the integration voltage by the desired gain of four without using a multi-input comparator, the charged integration capacitors are stacked during a SAR conversion phase as shown in FIG. 2B. In the SAR conversion phase, the input voltage Vin charges the CDAC capacitors. Two of the integration capacitors are stacked in series with the positive CDAC capacitor CDAC+ to apply a voltage of 2*Vint+Vin+ at a positive input terminal (+1x) of a comparator 225, where Vin+ is the positive component of the input voltage sample. Similarly, a remaining two of the integration capacitors are stacked in series with the negative CDAC capacitor CDAC− to apply voltage of −2*Vint−Vin− at a negative input terminal (−1x) of the comparator 225, where Vin− is the negative component of the input voltage sample. The comparator 225 thus forms a summation signal Vin+4*Vint that is compared to a reference voltage (not illustrated) during the SAR conversion stage. Although the resulting passive loop filter avoids the comparator input referred noise from the differential pair of transistors coupled to the +4x and −4x input terminals, avoids the power consumption, and avoids the die space demands of the active gain approach, note that both the positive and negative terminals of the stacked capacitors will each have a parasitic capacitive coupling to ground, which degrades the accuracy of the resulting ADC.

To avoid the problems of the active-gain and capacitor-stacking architectures, a passive-active hybrid gain loop filter is provided for a noise-shaping SAR ADC. As implied by the "passive-active hybrid" designation, the resulting loop filter utilizes both the active gain from a multi-input comparator and the passive gain from capacitor stacking. However, these features are intelligently combined so as to largely avoid the issues of excessive comparator input referred noise, excessive power consumption, and die space demands of an active gain approach. Similarly, the hybrid gain disclosed herein largely avoids the problems of excessive parasitic capacitive coupling of a stacked-capacitor architecture. The hybrid gain architecture may be implemented using one of two architectures disclosed herein. A first hybrid gain architecture is denoted herein as an adding hybrid gain architecture. A second hybrid gain architecture is denoted herein as a multiplying hybrid gain architecture. A noise-shaping SAR ADC with adding hybrid gain will be discussed first followed by a discussion of a noise-shaping SAR ADC with multiplying hybrid gain.

Noise-Shaping SAR ADC with Adding Hybrid Gain

Figure 3A:
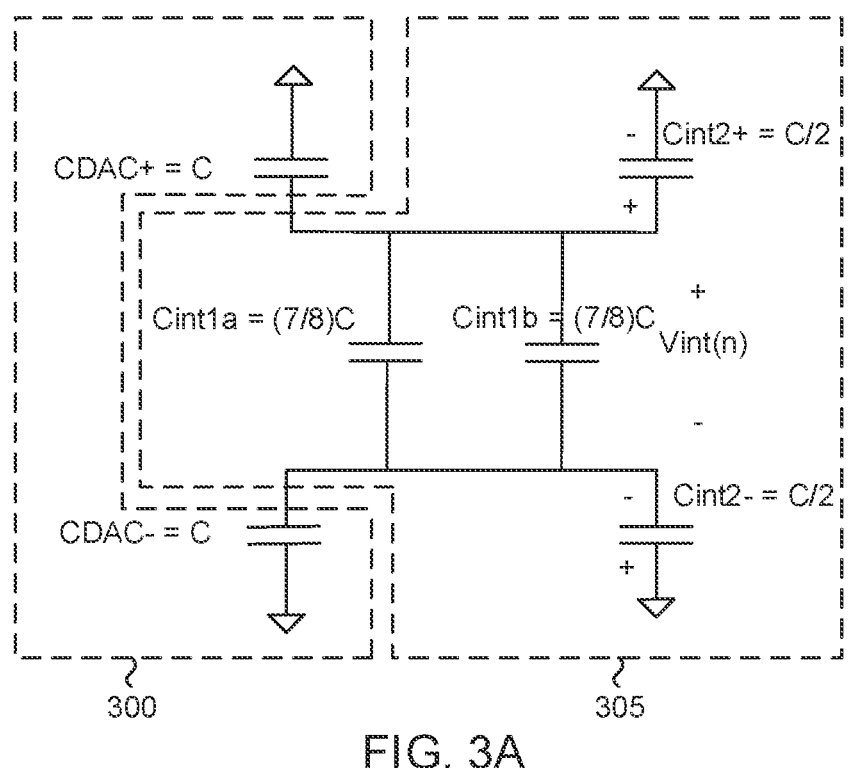
FIG. 3A is a diagram of a noise-shaping SAR ADC with adding hybrid gain during an integration phase in accordance with an aspect of the disclosure.

Consider the illustration of an adding hybrid gain architecture during an integration phase as shown in FIG. 3A. A CDAC 300 includes a positive CDAC capacitor CDAC+ that is charged with the positive component of the differential residue voltage Vres(n−1) prior to the integration phase. A positive terminal of the positive CDAC capacitor CDAC+ is also denoted herein as a positive output terminal of the CDAC 300. Similarly, the CDAC 300 includes a negative CDAC capacitor CDAC− that is charged with the negative component of the differential residue voltage Vres(n−1) prior to the integration phase. A negative terminal of the negative CDAC capacitor CDAC− is also denoted herein as a negative output terminal of the CDAC 300. As used herein, a "positive terminal" of a capacitor is defined as the capacitor terminal that is charged more positively than a "negative terminal" of the capacitor. A loop filter 305 includes a pair of first integration capacitors Cint1a and Cint1b. The integration capacitor Cint1b is also denoted herein as a first integration capacitor whereas the integration capacitor Cint1a is also denoted as a second integration capacitor. In addition, the loop filter 305 includes a pair of second integration capacitors formed by a positive integration capacitor Cint2+ and a negative integration capacitor Cint2−. The positive integration capacitor Cint2+ is also denoted herein as a third integration capacitor whereas the negative integration capacitor Cint2− is denoted as a fourth integration capacitor. The pair of second integration capacitors are coupled to a voltage node (e.g., ground or a common-mode voltage node) in a single-ended fashion analogous to the CDAC capacitors. In contrast, the first integration capacitors Cint1a and Cint1b are coupled in parallel in a differential fashion between a positive terminal of the capacitor Cint2+ and a negative terminal of the capacitor Cint2−.

Prior to the integration phase, the first integration capacitors Cint1a and Cint1b are charged with the integration voltage Vint(n−1) discussed earlier. In the integration phase, transfer switches are closed (not illustrated) to couple a positive terminal of the CDAC+ capacitor to the positive terminal of the Cint2+ capacitor and to couple to the positive terminals of the Cint1a and Cint1b capacitors. In addition, the transfer switches couple a negative terminal of the CDAC− capacitor to the negative terminal of the Cint2− capacitor and to the negative terminals of the Cint1a and Cint1b capacitors. For brevity, a capacitance of each of the Cint1a and Cint1b capacitors will also be designated as Cint1. Similarly, a capacitance of each of the Cint2+ and Cint2− capacitors will also be designated as Cint2. To provide the desired proportionality constant $\alpha$ of 0.8, Cint1*4+Cint2 may equal 4C, where C is the capacitance of the CDAC capacitors. It will thus be appreciated that a wide variety of capacitances may be assigned to Cint1 and Cint2 so long as the desired relationship of Cint*4+Cint2 equaling 4C is satisfied. In loop filter 305, Cint1 equals (7/8)*C and Cint2 equals C/2 but it will thus be appreciated that other capacitance values may be used in alternative implementations.

Figure 3B:
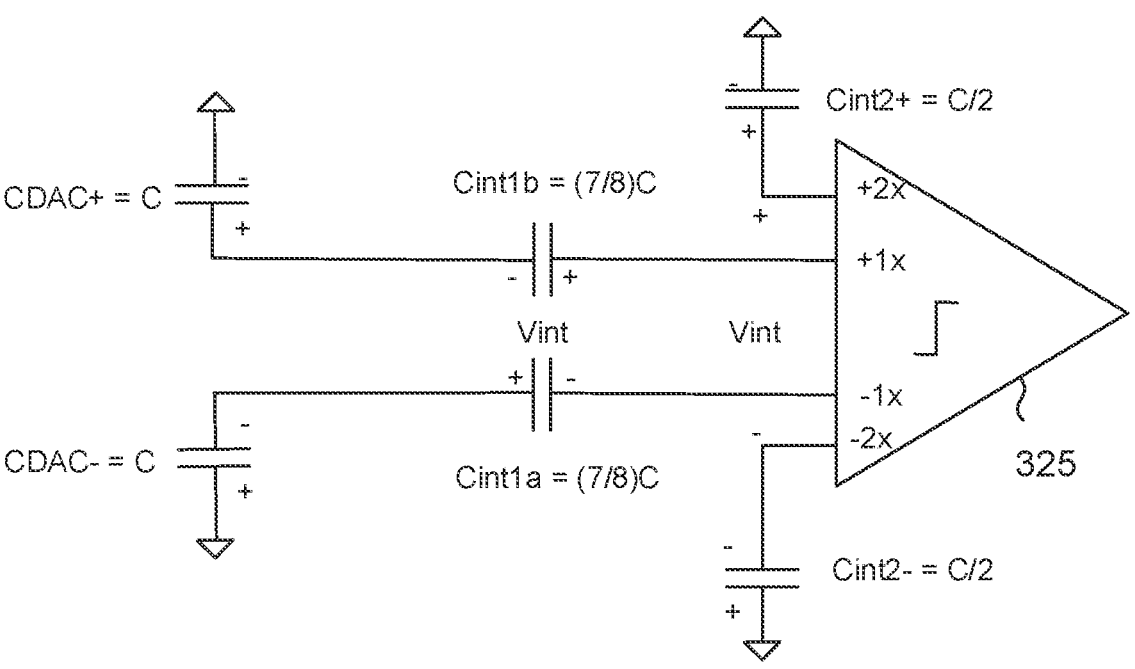
FIG. 3B is a diagram of a noise-shaping SAR ADC with adding hybrid gain during a SAR conversion phase in accordance with an aspect of the disclosure.

The integration phase produces the desired current integration voltage (Vint(n)) that equals 0.8*Vint(n−1)+ 0.2*Vres(n−1) as discussed earlier. During a SAR conversion phase as shown in FIG. 3B, a positive terminal of the CDAC+ capacitor couples to a negative terminal of the Cint1b capacitor that in turn has its positive terminal couple to a positive input terminal (+1x) of a multi-input comparator 325. The resulting stacking of the capacitors provides a voltage of Vin+Vint(n) at the +1x input terminal. The multi-input comparator 325 applies a unity gain to signals received at the +1x input terminal and a corresponding −1x input terminal. Similarly, a negative terminal of the CDAC− capacitor couples to a positive terminal of the Cint1a capacitor that in turn has its negative terminal couple to the −1x input terminal of the multi-input comparator 325. The resulting capacitor stacking provides a voltage of Vin−Vint(n) at the −1x input terminal. The multi-input comparator 325 will thus produce a voltage of Vin+2*Vint(n) from the coupling to its +1x and −1x input terminals for summing into a summed signal (not illustrated) within the multi-input comparator 325, where Vin is the current differential input voltage sample. Note that the SAR conversion phase occurs before an integration phase in an ADC computation cycle.

In addition, a positive terminal of the Cint2+ capacitor couples to a +2x input terminal of the multi-input comparator 325. Similarly, a negative terminal of the Cint2− capacitor couples to a −2x input terminal of the multi-input comparator 325. As denoted by the +2x and −2x designations, the multi-input comparator 325 applies twice the gain with respect to these input terminals as compared to the unity gain for the +1x and −1x input terminals. The multi-input comparator 325 will thus produce a voltage of 2*Vint(n) from the driving of the +2x and −2x input terminals. This signal is summed with the voltage of Vin+2*Vint(n) from the +1x and −1x terminals within the multi-input comparator 325 to form a summed signal (not illustrated) that equals the desired value of Vin+4*Vint(n). A SAR logic circuit (not shown in FIG. 3B but discussed further herein) such as a SAR finite-state machine may then adjust the CDAC 300 through a SAR-based search to convert the summed signal into a digital output signal (not illustrated).

A signal flow representation of a noise-shaping SAR ADC 400 with adding hybrid gain is shown in FIG. 4. For illustration clarity, the signal flow in ADC 400 is shown in FIG. 4 as being single-ended but it will be appreciated that instead differential signaling may be used as discussed with regard to FIGS. 3A and 3B. The voltage residue (Vres) from a previous ADC calculation cycle is formed at an adder 420 that represents the action of the CDAC 300. The integration phase discussed regarding FIG. 3A is performed by an integrator 405. In particular, the residue is delayed by one ADC calculation cycle, multiplied by 0.2 and added with a delayed version of the integration voltage that is multiplied by 0.8 so that an integration voltage Vint(n) produced by the integrator 405 equals 0.8*Vint(n−1)+0.2*Vres(n−1) as discussed earlier.

The stacking at the 1x input terminals of the multi-input comparator 325 during the SAR conversion phase of FIG. 3B is represented by a passive stage 415 that multiples the integration voltage Vint(n) by two and adds it at an adder 425 with the input voltage. The amplification at the 2x input terminals of the multi-input comparator 325 is represented by an active stage 410 that multiplies the integration voltage by two. The outputs from the passive stage 415 and the active stage 410 are added at an adder 430 to produce a digital output signal Dout that also feeds back to the CDAC 300 as represented by the adder 420. The addition of the output signals from the active stage 410 and the passive stage 415 at adder 430 illustrates the "adding" in an adding hybrid gain architecture.

Figure 5:
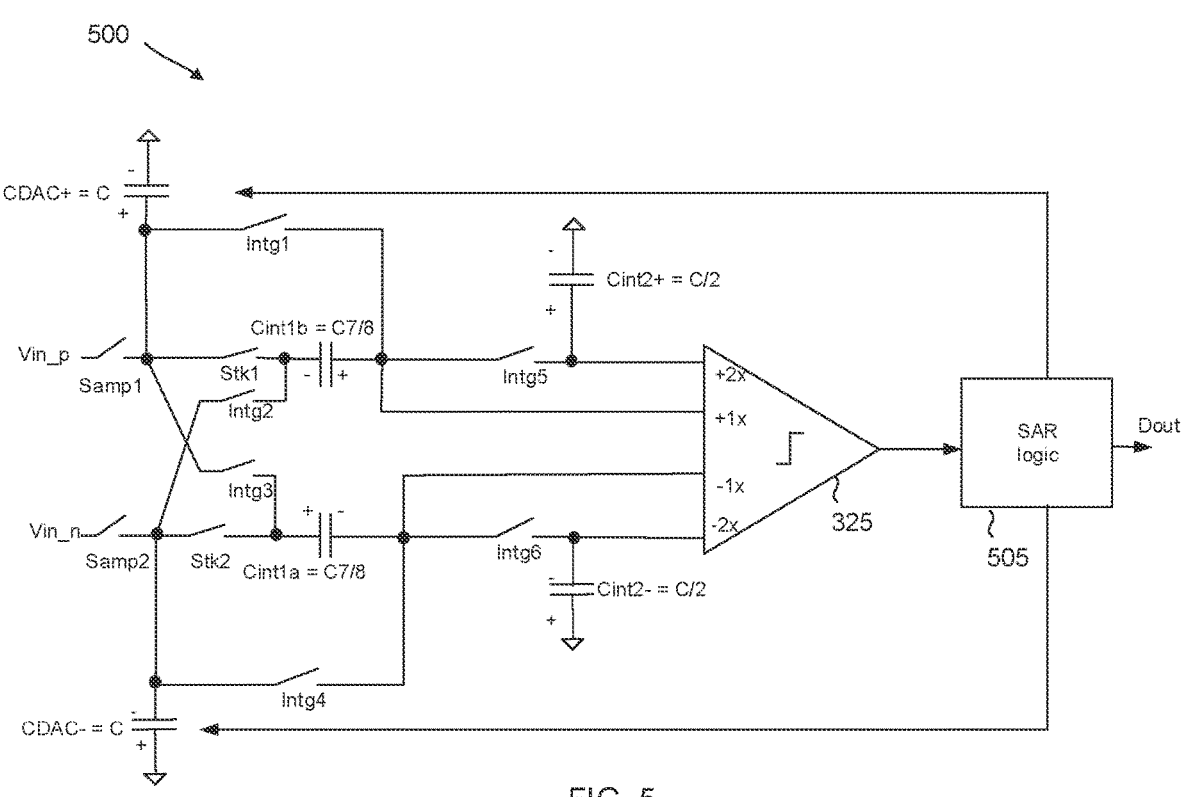
FIG. 5 is a circuit diagram of a noise-shaping SAR ADC with adding hybrid gain in accordance with an aspect of the disclosure.

A more detailed view of a noise-shaping SAR ADC 500 with adding hybrid gain is shown in FIG. 5. During an integration phase, a plurality of integration (Intg) switches close to couple the CDAC to the Cint1 and Cint2 capacitors as discussed regarding FIG. 3A. During the integration phase, a positive terminal of the CDAC capacitor CDAC+ (the positive output terminal of the CDAC 300) couples through a first integration switch Intg1 to a positive terminal of the Cint1b capacitor and couples through a fifth integration switch Intg5 to a positive terminal of the Cint2+ capacitor. Similarly, a third integration switch Intg3 couples the positive terminal of the CDAC capacitor CDAC+ to the positive terminal of the Cint1a capacitor. In addition, the negative terminal of the CDAC capacitor CDAC− (the negative output terminal of the CDAC 300) couples through a second integration switch Intg2 to the negative terminal of the Cint1b capacitor and couples through a fourth integration switch Intg4 to the negative terminal of the Cint1a capacitor. The negative terminal of the CDAC capacitor CDAC− also couples through the fourth integration switch Intg4 and through a sixth integration switch Intg6 to the negative terminal of the Cint2− capacitor. After the completion of the integration phase, the integration switches Intg1 through Intg6 are opened.

In a SAR conversion phase (which is also the amplification phase of the integration voltage Vint) in a subsequent ADC calculation cycle, a first sample switch Samp1 closes to charge the CDAC capacitor CDAC+ with a positive component Vin_p of the input voltage. Similarly, a second sample switch Samp2 closes to charge the CDAC capacitor CDAC− with a negative component Vin_n of the input voltage. With the CDAC capacitors thus charged and the sampling switches opened, a first stacking switch Stk1 closes to couple the positive terminal of the CDAC capacitor CDAC+ to the negative terminal of the Cint1b capacitor. A positive terminal of the Cintb capacitor couples to the +1x terminal of multi-input comparator 325 as discussed regarding FIG. 3B. In addition, a second stacking switch Stk2 closes to couple the negative terminal of the CDAC− capacitor to the positive terminal of the Cint1a capacitor. A negative terminal of the Cint1a capacitor couples to the −1x input terminal of the comparator 325. With Vin summed with 4*Vint to form a summed signal, the multi-input comparator 325 may then proceed to compare the resulting summed signal to a reference voltage (not illustrated) as controlled by a SAR logic circuit 505 (e.g., a SAR-based finite state machine). The SAR logic circuit 505 then controls the adjustment of the CDAC capacitances during a SAR-based search to convert the summed signal into a digital output signal Dout.

The +1x input terminal of a multi-input comparator such as multi-input comparator 325 is also denoted herein as a first positive input terminal. The +1x input terminal is also denoted herein as a positive unity-gain input terminal whereas the −1x input terminal is also denoted as a negative unity-gain input terminal. Similarly, the −1x input terminal is also denoted herein as a first negative input terminal. In addition, the +2x input terminal is also denoted herein as a second positive input terminal. The +2x input terminal is also denoted herein as a positive double-gain input terminal whereas the −2x input terminal is also denoted as a negative double-gain input terminal. Finally, the −2x input terminal is also denoted herein as a second negative input terminal.

Note that during an ADC calculation cycle, the SAR conversion phase precedes the integration phase. This is because the input voltage being digitized in a current ADC cycle is added with the integration voltage from the integration phase in the preceding ADC cycle to form a modified input voltage sample (the summed signal discussed herein) that is then converted in the SAR conversion phase to a digital output signal. A noise-shaping SAR ADC with multiplying hybrid gain will now be discussed.

Noise-Shaping SAR ADC with Multiplying Hybrid Gain

Figure 6A:
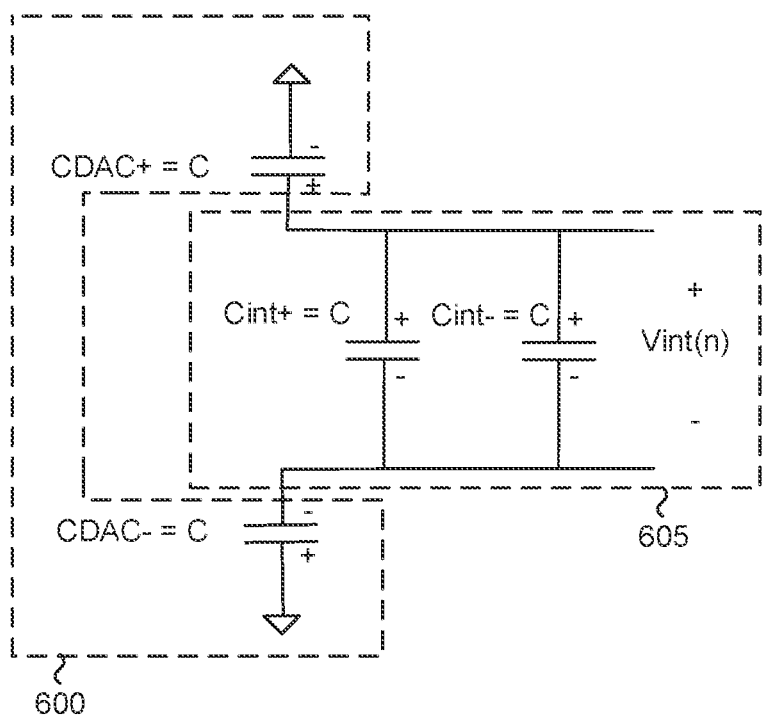
FIG. 6A is a diagram of a noise-shaping SAR ADC with multiplying hybrid gain during an integration phase in accordance with an aspect of the disclosure.

An illustration of a multiplying hybrid gain architecture during an integration phase as shown in FIG. 6A. A CDAC 600 includes a positive CDAC capacitor CDAC+ that is charged with the positive component of the differential residue voltage Vres(n−1) prior to the integration phase. Similarly, the CDAC 600 includes a negative CDAC capacitor CDAC− that is charged with the negative component of the differential residue voltage Vres(n−1) prior to the integration phase. A loop filter 605 includes a pair of integration capacitors Cint+ and Cint−. The integration capacitor Cint+ is also denoted herein as a first integration capacitor whereas the integration capacitor Cint− is also denoted as a second integration capacitor. The integration capacitors Cint+ and Cint− are coupled in parallel. Prior to the integration phase, the integration capacitors Cint+ and Cint− are charged with the differential integration voltage Vint(n−1) discussed earlier. In the integration phase, transfer switches are closed (not illustrated) to couple a positive terminal of the CDAC+ capacitor to the positive terminals of the Cint+ and Cint− capacitors. The positive terminal of the CDAC+ capacitor is also denoted herein as a positive output terminal of the CDAC 600. In addition, the transfer switches couple a negative terminal of the CDAC− capacitor to the negative terminals of the Cint+ and Cint− capacitors. The negative terminal of the CDAC− capacitor is also denoted herein as a negative output terminal of the CDAC 600. A capacitance of each of the Cint+ and Cint− capacitors equals a capacitance C of the CDAC capacitors.

Figure 6B:
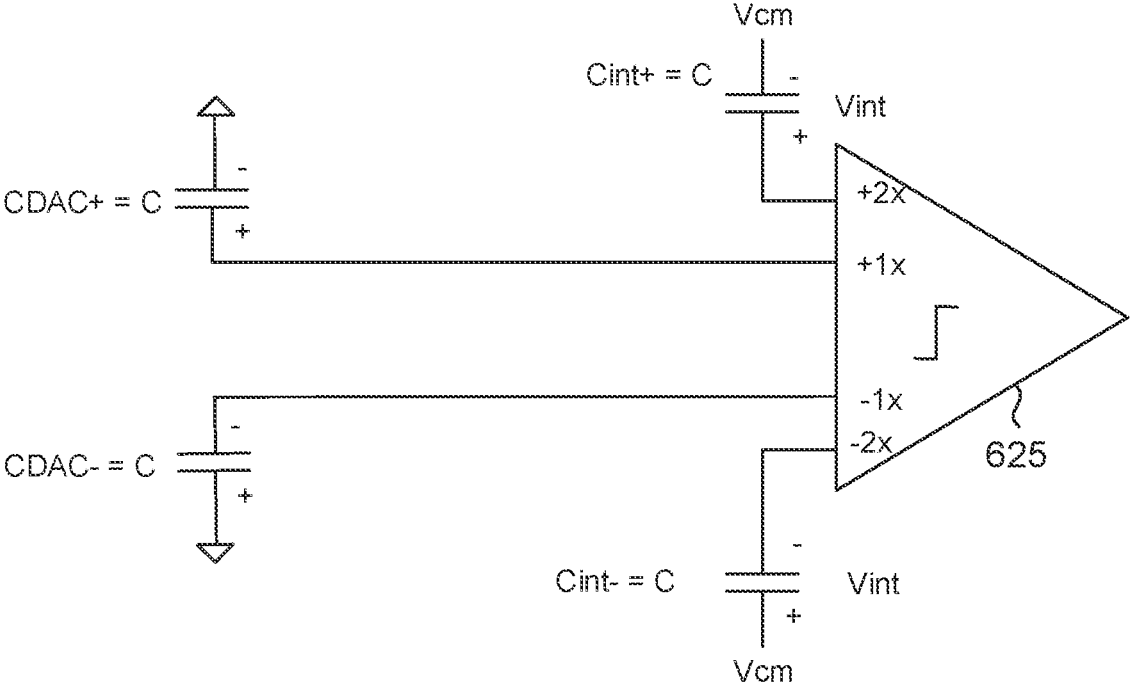
FIG. 6B is a diagram of a noise-shaping SAR ADC with multiplying hybrid gain during a SAR conversion phase in accordance with an aspect of the disclosure.

The integration phase produces the current integration voltage (Vint(n)) that equals 0.8*Vint(n−1) and 0.2*Vres(n−1) as discussed earlier. During a SAR conversion phase as shown in FIG. 6B that occurs in a subsequent ADC calculation cycle, a positive terminal of the positive CDAC capacitor CDAC+ couples to a +1x input terminal in a multi-input comparator 625. Similarly, a negative terminal of the negative CDAC capacitor CDAC− couples to a −1x input terminal in the multi-input comparator 625. As implied by the 1x designations, multi-input comparator 625 applies a unity gain to the +1x and −1x input terminals. The multi-input comparator 625 will thus produce a voltage of Vin for summing into a summed signal (not illustrated) within the comparator 625, where Vin is the current differential input voltage sample.

In addition, a positive terminal of the Cint+ capacitor couples to a +2x input terminal of the multi-input comparator 625. A node for a common-mode voltage Vcm of the CDAC 600 couples to a negative terminal of the Cint+ capacitor. A negative terminal of the Cint− capacitor couples to a −2x input terminal of the multi-input comparator 625. The node for the common-mode voltage Vcm couples to a positive terminal of the Cint− capacitor. The differential driving of the Cint+ and Cint− capacitors thus produces a differential voltage of 2*Vint across the +2x and −2x input terminals. Because of the two-times gain for these terminals, the multi-input comparator 625 will thus produce a voltage of 4*Vint(n) from the driving of the +2x and −2x input terminals. This signal is summed within the comparator 625 with the voltage of Vin from the +1x and −1x terminals to form a summed signal (not illustrated) that equals the desired value of Vin+4*Vint(n). A SAR logic circuit (not shown in FIG. 6B) such as a SAR finite-state machine may then adjust the CDAC through a SAR-based search to convert the summed signal into a digital output signal (not illustrated).

Figure 7:
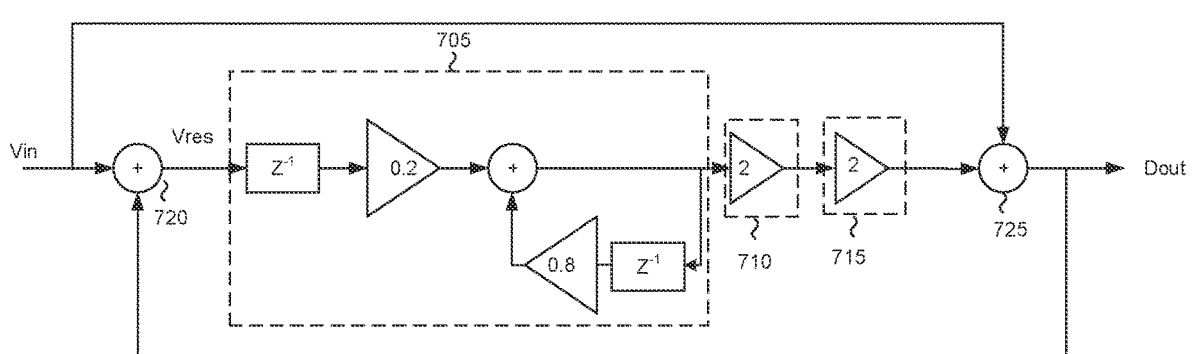
FIG. 7 is a signal flow representation of a noise-shaping SAR ADC with multiplying hybrid gain in accordance with an aspect of the disclosure.

A signal flow representation of a noise-shaping SAR ADC 700 with multiplying hybrid gain is shown in FIG. 7. For illustration clarity, the signal flow in ADC 700 is shown as being single-ended but it will be appreciated that instead differential signaling may be used as discussed with regard to FIGS. 6A and 6B. The voltage residue (Vres) from a previous ADC calculation cycle is formed at an adder 720 that represents the action of the CDAC 600. The integration discussed with respect to FIG. 6A is represented by an integrator 705. In particular, the residue is delayed by one ADC calculation cycle, multiplied by 0.2 and added with a delayed version of the integration voltage that is multiplied by 0.8 so that an integration voltage Vint(n) produced by the integrator 705 equals 0.8*Vint(n−1)+0.2*Vres(n−1) as discussed earlier.

The differential capacitor driving of the 2x input terminals of the multi-input comparator 625 during the conversion phase of FIG. 6B is represented by a passive stage 710 that multiples the integration voltage Vint(n) by two. The amplification by the multi-input comparator 625 with respect to its +2x and −2x inpt terminals is represented by an active stage 715 that multiplies 2*Vint(n) by two again to produce 4*Vint(n). The addition of Vin with 4*Vint(n) is represented by an adder 725 to produce a digital output signal Dout that also feeds back to the CDAC 600 as represented by the adder 720. The two times two multiplication from stages 710 and 715 is an illustration of the "multiplying" in a multiplying hybrid gain architecture.

Figure 8:
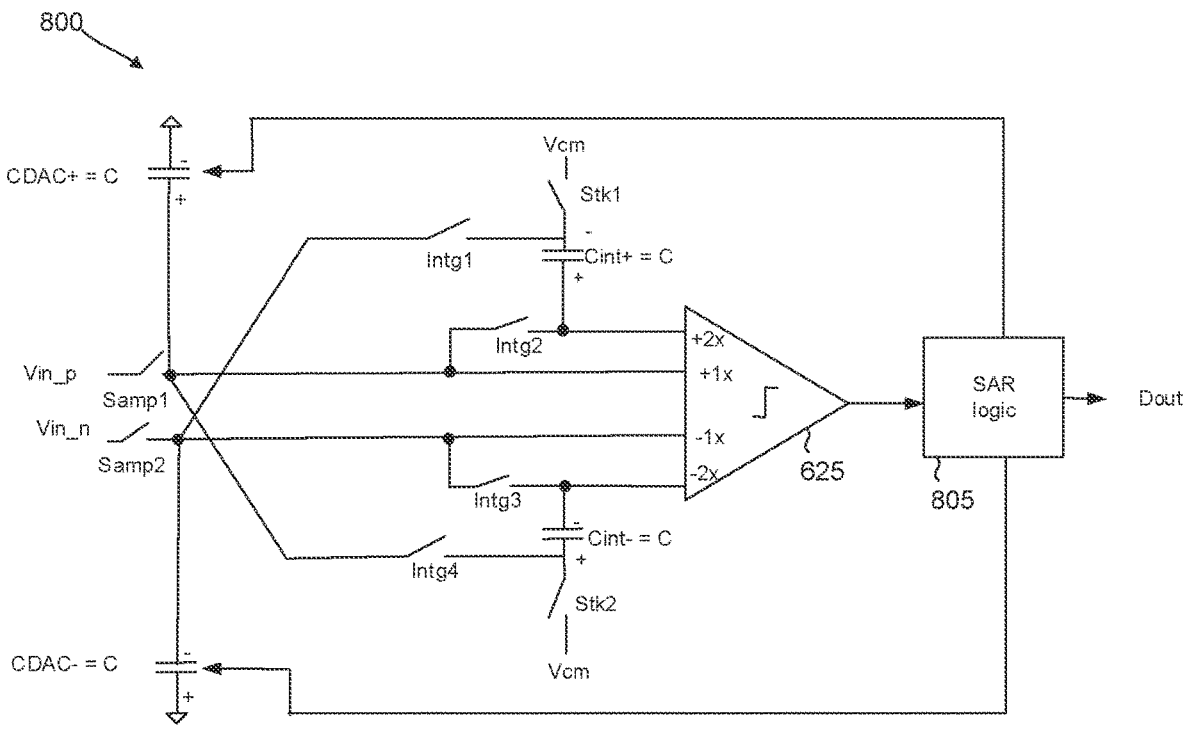
FIG. 8 is a circuit diagram of a noise-shaping SAR ADC with multiplying hybrid gain in accordance with an aspect of the disclosure.

A more detailed view of a noise-shaping SAR ADC 800 with multiplying hybrid gain is shown in FIG. 8. During an integration phase, each switch in a plurality of integration (Intg) switches is closed to couple the CDAC to the Cint+ and Cint− capacitors as discussed regarding FIG. 6A. In particular, a positive terminal of the CDAC capacitor CDAC+ couples through a second integration switch Intg2 to a positive terminal of the Cint+ capacitor and couples through a fourth integration switch Intg4 to a positive terminal of the Cint− capacitor. In addition, the negative terminal of the CDAC capacitor CDAC− couples through a first integration switch Intg1 to the negative terminal of the Cint+ capacitor and couples through a third integration switch Intg3 to the negative terminal of the Cint− capacitor. After the completion of the integration phase, the integration switches Intg1 through Intg4 are opened.

In a SAR conversion phase (which is also the amplification phase of the integration voltage Vint), a first sample switch Samp1 closes to charge the CDAC capacitor CDAC+ with the positive component Vin_p of the differential input voltage. Similarly, a second sample switch Samp2 closes to charge the CDAC capacitor CDAC− with a negative component Vin_n of the differential input voltage. With the CDAC capacitors thus charged, a first stacking switch Stk1 closes to couple the negative terminal of the Cint+ capacitor to a node for the common-mode voltage Vcm. A positive terminal of the Cint+ capacitor couples to the +2x input terminal of the multi-input comparator 625 as discussed regarding FIG. 6B. In addition, a second stacking switch Stk2 closes to couple the positive terminal of the Cint− capacitor to the node for the common-mode voltage Vcm. A negative terminal of the Cint− capacitor couples to the −2x input terminal of the multi-input comparator 625. The positive terminal of the CDAC+ capacitor couples to the +1x input terminal of the multi-input comparator 625 whereas the negative terminal of the CDAC− capacitor couples to the −1x input terminal. The multi-input comparator 625 may then compare a resulting summed signal equaling Vin+ 4*Vint to a reference voltage as controlled by a SAR logic circuit 805 (e.g., a SAR-based finite state machine). The SAR logic circuit 805 controls an adjustment of the CDAC 600 capacitance during a SAR-based search to convert the summed signal into a digital output signal Dout.

Regardless of whether an adding or multiplying hybrid gain is used, note that the multi-input comparators 325 and 625 have reduced input referred noise due to the maximum gain of just two as compared to the use of a gain of four in the multi-input comparator 125 to produce the desired amplification of Vint by four. In addition, a stacking of just two capacitors is used in the adding hybrid gain of ADC 500 to reduce the sensitivity to parasitic capacitance. The total capacitance of the adding hybrid gain ADC 500 is just 4.75C whereas the total capacitance of the multiplying hybrid gain ADC 800 is only 4C. Both types of hybrid gain thus achieve a significant reduction in the die area for implementing the integration capacitors as compared to the traditional active gain discussed with regard to FIGS. 1A and 1B.

Figure 9:
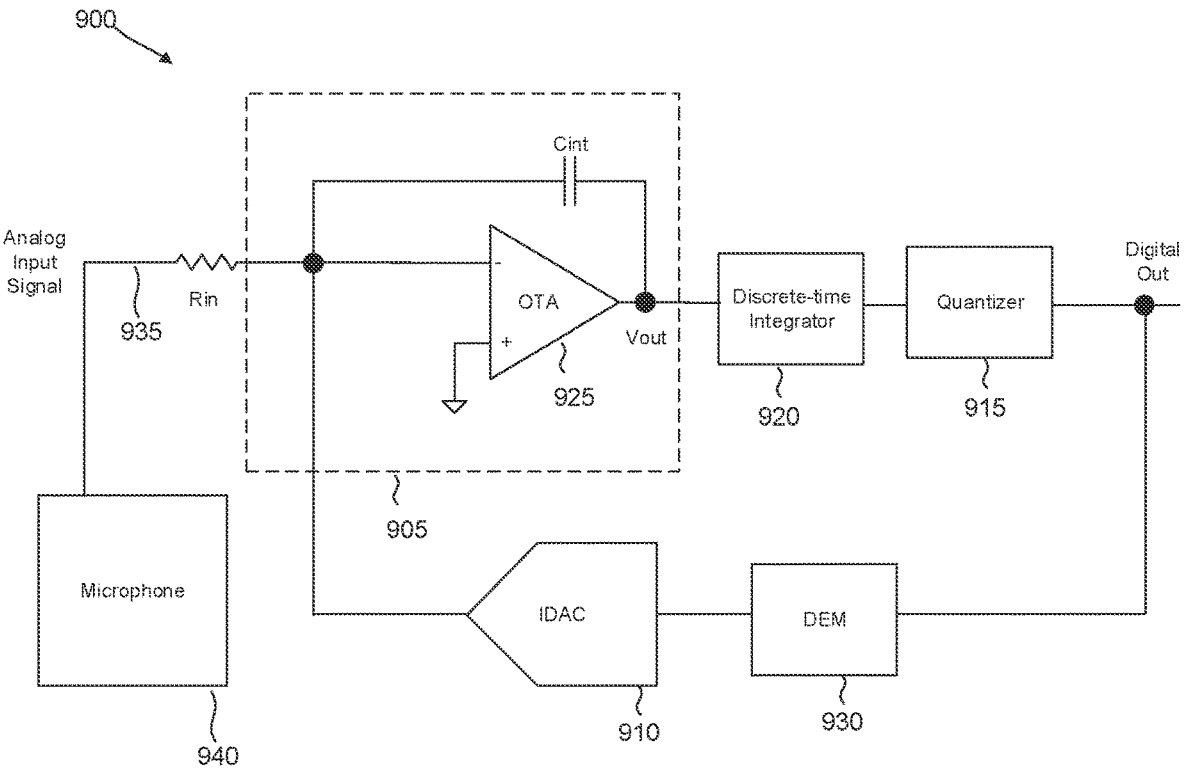
FIG. 9 is a diagram of a sigma-delta analog-to-digital converter in which the quantizer is a noise-shaping SAR ADC with hybrid gain in accordance with an aspect of the disclosure.

A noise-shaping SAR ADC with hybrid gain (either adding or multiplying) may be employed in a wide variety of applications. For example, a noise-shaping SAR ADC with hybrid gain may function as a quantizer 915 in a sigma-delta analog-to-digital converter 900 as shown in FIG. 9. A first integration stage 905 is a continuous-time integration stage that integrates according to a resistor-capacitor (RC) time constant. An input resistor Rin functions as the R in the RC time constant. An input signal being quantized such as an audio signal from a micro-electromechanical system (MEMS) microphone 940 drives an input terminal 935 of the input resistor whereas another terminal of the input resistor couples to an inverting terminal of a differential amplifier such as an operational transconductance amplifier (OTA) 925. An integration capacitor that functions as the C in the RC time constant couples between the inverting terminal and an output terminal of the OTA 925. The time constant thus equals Rin*Cint, where Rin is the resistance of the input resistor and Cint is the capacitance of the integration capacitor. A feedback current digital-to-analog converter (IDAC) 910 also drives the inverting terminal.

A discrete-time integrator 920 integrates an output voltage signal Vout from the first integration stage 905 to provide an integrated signal that is quantized by the quantizer 915 to provide a digital output signal. After processing by a dynamic element matching function 930, the digital output signal feeds back through the IDAC 910 to the inverting node of the OTA 925.

A method of hybrid gain for a noise-shaping SAR ADC will now be discussed regarding the flowchart of FIG. 10. The method includes an act 1000 of charge sharing between a capacitive digital-to-analog converter and a plurality of integration capacitors to form an integration voltage for a current cycle. The charge sharing discussed with respect to FIGS. 3A and 6A is an example of act 1000. In addition, the method includes an act 1005 of arranging the plurality of integration capacitors to passively apply a first gain to the integration voltage. The stacking of the Cint1a and Cint1b capacitors as discussed with respect to FIGS. 3B and 5 is an example of act 1005. Similarly, the differential driving of the Cint+ and the Cint− capacitors as discussed with respect to FIGS. 6B and 8 is another example of act 1005. Finally, the method includes an act 1010 of amplifying the integration voltage according to a second gain in a multi-input comparator. The amplification at the +2x and −2x input terminals of the multi-input comparators 325 and 625 is an example of act 1010.

Figure 11:
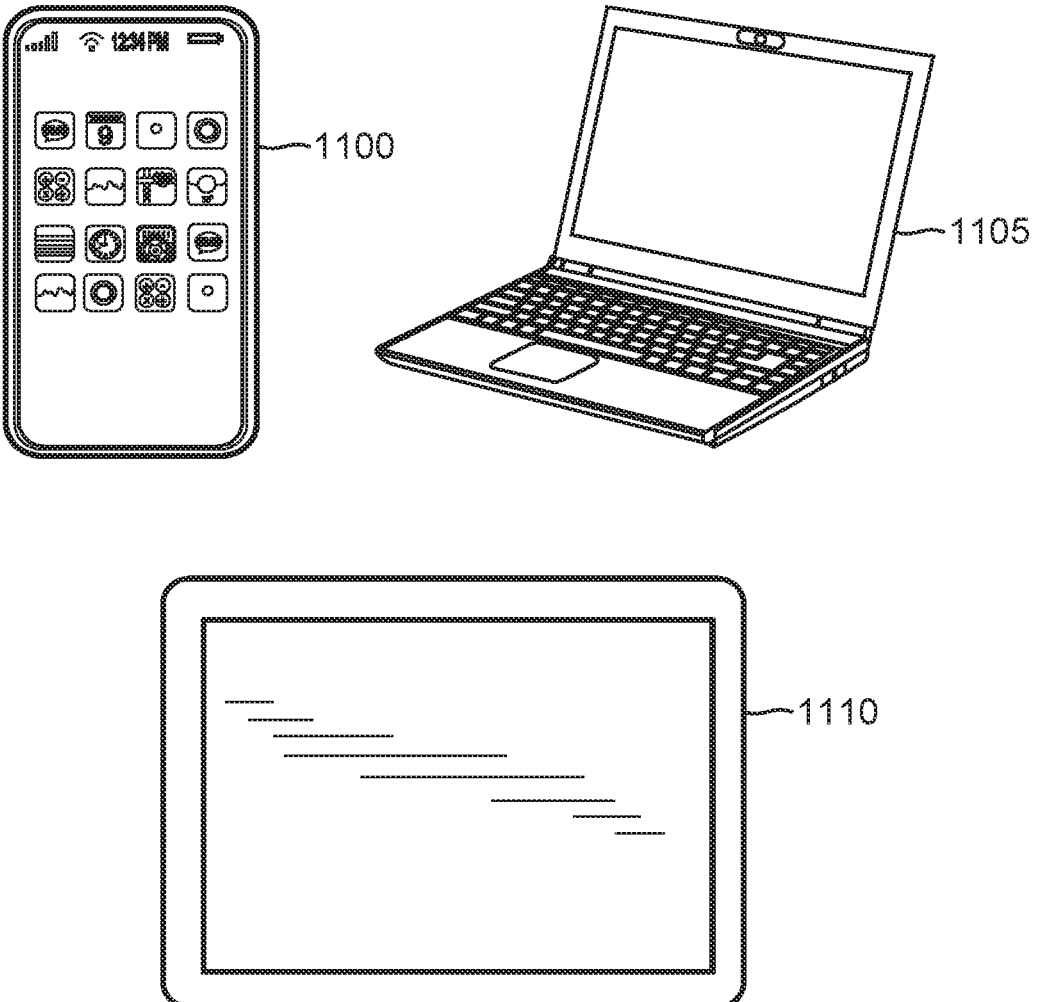
FIG. 11 illustrates some example electronic systems including a microphone generating an audio signal that is converted by a noise-shaping SAR ADC with hybrid gain in accordance with an aspect of the disclosure.

A noise-shaping SAR analog-to-digital converter with hybrid gain as disclosed herein may be incorporated in a wide variety of electronic systems. For example, as shown in FIG. 11, a cellular telephone 1100, a laptop computer 1105, and a tablet PC 1110 may all include an analog-to-digital converter that functions to process an audio signal from a micro-electromechanical system (MEMS) microphone in accordance with the disclosure. Other exemplary electronic systems such as an earbud, a music player, a video player, a communication device, and a personal computer may also be configured with an analog-to-digital converter constructed in accordance with the disclosure.

The disclosure will now be summarized through the following example clauses:

Clause 1. A noise-shaping successive-approximation-register analog-to-digital converter, comprising:
  a multi-input comparator including a first positive input terminal, a first negative input terminal, a second positive input terminal, and a second negative input terminal;
  a capacitive digital-to-analog converter having a positive output terminal and a negative output terminal;
  a loop filter including a first integration capacitor having a positive terminal coupled to the first positive input terminal, a second integration capacitor having a negative terminal coupled to the first negative input terminal, a third integration capacitor having a negative terminal coupled to a voltage node and a positive terminal coupled to the second positive input terminal, and a fourth integration capacitor having a positive terminal coupled to the voltage node and a negative terminal coupled to the second negative input terminal;
  a first stacking switch coupled between the positive output terminal and a negative terminal of the first integration capacitor; and
  a second stacking switch coupled between the negative output terminal and a positive terminal of the second integration capacitor, wherein the first stacking switch and the second stacking switch are each configured to close during a conversion phase.

Clause 2. The noise-shaping successive-approximation-register analog-to-digital converter of clause 1, further comprising:
  a plurality of integration switches configured to couple the first integration capacitor and the second integration capacitor in parallel between the positive output terminal and the negative output terminal during an integration phase, the plurality of integration switches being further configured during the integration phase to couple the positive output terminal to the positive terminal of the third integration capacitor and to couple the negative output terminal to the negative terminal of the fourth integration capacitor, wherein the voltage node is ground.

Clause 3. The noise-shaping successive-approximation-register analog-to-digital converter of any of clauses 1-2, wherein the multi-input comparator is configured to apply a first gain with respect to the first positive input terminal and to the first negative input terminal and to apply a second gain with respect to the second positive input terminal and to the second negative input terminal.

Clause 4. The noise-shaping successive-approximation-register analog-to-digital converter of clause 3, wherein the first gain is a unity gain and the second gain equals twice the first gain.

Clause 5. The noise-shaping successive-approximation-register analog-to-digital converter of any of clauses 2-4, wherein the plurality of integration switches comprises:
    a first integration switch coupled between the positive output terminal and the first positive input terminal;
    a second integration switch coupled between the negative output terminal and the negative terminal of the first integration capacitor;
    a third integration switch coupled between the positive output terminal and the positive terminal of the second integration capacitor;
    a fourth integration switch coupled between the negative output terminal and the negative terminal of the second integration capacitor;
    a fifth integration switch coupled between the positive terminal of the first integration capacitor and the positive terminal of the third integration capacitor; and
    a sixth integration switch coupled between the negative terminal of the second integration capacitor and the negative terminal of the fourth integration capacitor.

Clause 6. The noise-shaping successive-approximation-register analog-to-digital converter of any of clauses 1-5, wherein the first integration capacitor and the second integration capacitor each has a first capacitance, and wherein the third integration capacitor and the fourth integration capacitor each has a second capacitance.

Clause 7. The noise-shaping successive-approximation-register analog-to-digital converter of clause 6, wherein a sum of four times the first capacitance and the second capacitance equals twice a total capacitance of the capacitive digital-to-analog converter (CDAC).

Clause 8. The noise-shaping successive-approximation-register analog-to-digital converter of any of clauses 6-7, wherein a total capacitance of the capacitive digital-to-analog converter (CDAC) equals twice times a CDAC capacitance, and wherein the first capacitance is seven-eighths of the CDAC capacitance and the second capacitance is one-half of the CDAC capacitance.

Clause 9. The noise-shaping successive-approximation-register analog-to-digital converter of any of clauses 1-8, wherein the noise-shaping successive-approximation-register analog-to-digital converter is a quantizer in a sigma-delta analog-to-digital converter.

Clause 10. The noise-shaping successive-approximation-register analog-to-digital converter of clause 9, wherein the sigma-delta analog-to-digital converter is configured to digitize an audio signal from a micro-electromechanical system (MEMS) microphone.

Clause 11. A method of performing hybrid gain in a noise-shaping successive-approximation-register analog-to-digital converter, comprising:
    charge sharing between a capacitive digital-to-analog converter and a plurality of integration capacitors to form an integration voltage for a current cycle;
    arranging the plurality of integration capacitors to passively apply a first gain to the integration voltage; and
    amplifying the integration voltage according to a second gain in a multi-input comparator.

Clause 12. The method of clause 11, wherein arranging the plurality of integration capacitors comprises:

coupling a positive output terminal of the capacitive digital-to-analog converter to a negative terminal of a first integration capacitor from the plurality of integration capacitors;
    coupling a positive terminal of the first integration capacitor to a positive unity-gain input terminal of the multi-input comparator;
    coupling a negative output terminal of the capacitive digital-to-analog converter to a positive terminal of a second integration capacitor from the plurality of integration capacitors; and
    coupling a negative terminal of the second integration capacitor to a negative unity-gain input terminal of the multi-input comparator.

Clause 13. The method of clause 12, wherein amplifying the integration voltage comprises:
    coupling a positive terminal of a third integration capacitor from the plurality of integration capacitors to a positive double-gain input terminal of the multi-input comparator while coupling a negative terminal of the third integration capacitor to ground; and
    coupling a negative terminal of a fourth integration capacitor from the plurality of integration capacitors to a negative double-gain input terminal of the multi-input comparator while coupling a positive terminal of the fourth integration capacitor to ground.

Clause 14. The method of clause 11, wherein arranging the plurality of integration capacitors comprises:
    coupling a positive terminal of both a first integration capacitor and a second integration capacitor from the plurality of integration capacitors to a positive output terminal of the capacitive digital-to-analog converter; and
    coupling a negative terminal of both the first integration capacitor and the second integration capacitor to a negative output terminal of the capacitive digital-to-analog converter.

Clause 15. The method of clause 14, wherein amplifying the integration voltage comprises:
    coupling the positive terminal of the first integration capacitor to a positive double-gain input terminal of the multi-input comparator while coupling the negative terminal of the first integration capacitor to a node for a common-mode voltage; and
    coupling the negative terminal of the second integration capacitor to a negative double-gain input terminal of the multi-input comparator while coupling the positive terminal of the second integration capacitor to the node for the common-mode voltage.

Clause 16. A noise-shaping successive-approximation-register analog-to-digital converter, comprising:
    a multi-input comparator including a first positive input terminal, a first negative input terminal, a second positive input terminal, and a second negative input terminal;
    a capacitive digital-to-analog converter having a positive output terminal coupled to the first positive input terminal and having a negative output terminal coupled to the first negative input terminal;
    a loop filter including a first integration capacitor having a positive terminal coupled to the second positive input terminal and including a second integration capacitor having a negative terminal coupled to the second negative input terminal;
    a first stacking switch coupled between a negative terminal of the first integration capacitor and a node for a common-mode voltage; and a second stacking switch coupled between a positive terminal of the second integration capacitor and the node for the common-mode voltage.

Clause 17. The noise-shaping successive-approximation-register analog-to-digital converter of clause 16, further comprising:

a plurality of integration switches configured to couple both the positive terminal of the first integration capacitor and the positive terminal of the second integration capacitor to the positive output terminal during an integration phase, the plurality of integration switches being further configured during the integration phase to couple the both the negative terminal of the first integration capacitor and the negative terminal of the second integration capacitor to the negative output terminal.

Clause 18. The noise-shaping successive-approximation-register analog-to-digital converter of clause 17, wherein the plurality of integration switches comprises:

a first integration switch coupled between the negative terminal of the first integration capacitor and the negative output terminal;

a second integration switch coupled between the positive terminal of the first integration capacitor and the positive output terminal;

a third integration switch coupled between the negative terminal of the second integration capacitor and the negative output terminal; and a fourth integration switch coupled between the positive terminal of the second integration capacitor and the positive output terminal.

Clause 19. The noise-shaping successive-approximation-register analog-to-digital converter of any of clauses 16-18, wherein a total capacitance of the capacitive digital-to-analog converter (CDAC) equals two times a CDAC capacitance, and wherein a capacitance of each of the first integration capacitor and the second integration capacitor equals the CDAC capacitance.

Clause 20. The noise-shaping successive-approximation-register analog-to-digital converter of any of clauses 16-19, wherein the multi-input comparator is configured to apply a unity gain with respect to the first positive input terminal and to the second positive input terminal and to apply twice the unity gain with respect to the second positive input terminal and to the second negative input terminal.

As those of some skill in this art will by now appreciate and depending on the particular application at hand, many modifications, substitutions and variations can be made in and to the materials, apparatus, configurations and methods of use of the devices of the present disclosure without departing from the scope thereof as defined by the appended claims. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A noise-shaping successive-approximation-register analog-to-digital converter, comprising:

a multi-input comparator including a first positive input terminal, a first negative input terminal, a second positive input terminal, and a second negative input terminal;

a capacitive digital-to-analog converter having a positive output terminal and a negative output terminal;

a loop filter including a first integration capacitor having a positive terminal coupled to the first positive input terminal, a second integration capacitor having a negative terminal coupled to the first negative input terminal, a third integration capacitor having a negative terminal coupled to a voltage node and a positive terminal coupled to the second positive input terminal, and a fourth integration capacitor having a positive terminal coupled to the voltage node and a negative terminal coupled to the second negative input terminal;

a first stacking switch coupled between the positive output terminal and a negative terminal of the first integration capacitor; and a second stacking switch coupled between the negative output terminal and a positive terminal of the second integration capacitor, wherein the first stacking switch and the second stacking switch are each configured to close during a conversion phase.

2. The noise-shaping successive-approximation-register analog-to-digital converter of claim 1, further comprising:

a plurality of integration switches configured to couple the first integration capacitor and the second integration capacitor in parallel between the positive output terminal and the negative output terminal during an integration phase, the plurality of integration switches being further configured during the integration phase to couple the positive output terminal to the positive terminal of the third integration capacitor and to couple the negative output terminal to the negative terminal of the fourth integration capacitor, wherein the voltage node is ground.

3. The noise-shaping successive-approximation-register analog-to-digital converter of claim 1, wherein the multi-input comparator is configured to apply a first gain with respect to the first positive input terminal and to the first negative input terminal and to apply a second gain with respect to the second positive input terminal and to the second negative input terminal.

4. The noise-shaping successive-approximation-register analog-to-digital converter of claim 3, wherein the first gain is a unity gain and the second gain equals twice the first gain.

5. The noise-shaping successive-approximation-register analog-to-digital converter of claim 2, wherein the plurality of integration switches comprises:

a first integration switch coupled between the positive output terminal and the first positive input terminal;

a second integration switch coupled between the negative output terminal and the negative terminal of the first integration capacitor;

a third integration switch coupled between the positive output terminal and the positive terminal of the second integration capacitor;

a fourth integration switch coupled between the negative output terminal and the negative terminal of the second integration capacitor;

a fifth integration switch coupled between the positive terminal of the first integration capacitor and the positive terminal of the third integration capacitor; and a sixth integration switch coupled between the negative terminal of the second integration capacitor and the negative terminal of the fourth integration capacitor.

6. The noise-shaping successive-approximation-register analog-to-digital converter of claim 1, wherein the first integration capacitor and the second integration capacitor each has a first capacitance, and wherein the third integration capacitor and the fourth integration capacitor each has a second capacitance.

7. The noise-shaping successive-approximation-register analog-to-digital converter of claim 6, wherein a sum of four times the first capacitance and the second capacitance equals two times a total capacitance of the capacitive digital-to-analog converter (CDAC).

8. The noise-shaping successive-approximation-register analog-to-digital converter of claim 6, wherein a total capacitance of the capacitive digital-to-analog converter (CDAC) equals two times a CDAC capacitance, and wherein the first capacitance is seven-eighths of the CDAC capacitance and the second capacitance is one-half of the CDAC capacitance.

9. The noise-shaping successive-approximation-register analog-to-digital converter of claim 1, wherein the noise-shaping successive-approximation-register analog-to-digital converter is a quantizer in a sigma-delta analog-to-digital converter.

10. The noise-shaping successive-approximation-register analog-to-digital converter of claim 9, wherein the sigma-delta analog-to-digital converter is configured to digitize an audio signal from a micro-electromechanical system (MEMS) microphone.

11. A method of performing hybrid gain in a noise-shaping successive-approximation-register analog-to-digital converter, comprising:

charge sharing between a capacitive digital-to-analog converter and a plurality of integration capacitors to form an integration voltage for a current cycle;

arranging the plurality of integration capacitors to passively apply a first gain to the integration voltage; and amplifying the integration voltage according to a second gain in a multi-input comparator, wherein arranging the plurality of integration capacitors comprises coupling a positive output terminal of the capacitive digital-to-analog converter to a negative terminal of a first integration capacitor from the plurality of integration capacitors, coupling a positive terminal of the first integration capacitor to a positive unity-gain input terminal of the multi-input comparator, coupling a negative output terminal of the capacitive digital-to-analog converter to a positive terminal of a second integration capacitor from the plurality of integration capacitors, and coupling a negative terminal of the second integration capacitor to a negative unity-gain input terminal of the multi-input comparator.

12. The method of claim 11, wherein amplifying the integration voltage comprises:

coupling a positive terminal of a third integration capacitor from the plurality of integration capacitors to a positive double-gain input terminal of the multi-input comparator while coupling a negative terminal of the third integration capacitor to ground; and coupling a negative terminal of a fourth integration capacitor from the plurality of integration capacitors to a negative double-gain input terminal of the multi-input comparator while coupling a positive terminal of the fourth integration capacitor to ground.

13. A method of performing hybrid gain in a noise-shaping successive-approximation-register analog-to-digital converter, comprising:

charge sharing between a capacitive digital-to-analog converter and a plurality of integration capacitors to form an integration voltage for a current cycle;

arranging the plurality of integration capacitors to passively apply a first gain to the integration voltage; and amplifying the integration voltage according to a second gain in a multi-input comparator, wherein arranging the plurality of integration capacitors comprises coupling a positive terminal of both a first integration capacitor and a second integration capacitor from the plurality of integration capacitors to a positive output terminal of the capacitive digital-to-analog converter, and coupling a negative terminal of both the first integration capacitor and the second integration capacitor to a negative output terminal of the capacitive digital-to-analog converter; and wherein amplifying the integration voltage comprises:

coupling the positive terminal of the first integration capacitor to a positive double-gain input terminal of the multi-input comparator while coupling the negative terminal of the first integration capacitor to a node for a common-mode voltage, and coupling the negative terminal of the second integration capacitor to a negative double-gain input terminal of the multi-input comparator while coupling the positive terminal of the second integration capacitor to the node for the common-mode voltage.

14. A noise-shaping successive-approximation-register analog-to-digital converter, comprising:

a multi-input comparator including a first positive input terminal, a first negative input terminal, a second positive input terminal, and a second negative input terminal;

a capacitive digital-to-analog converter having a positive output terminal coupled to the first positive input terminal and having a negative output terminal coupled to the first negative input terminal;

a loop filter including a first integration capacitor having a positive terminal coupled to the second positive input terminal and including a second integration capacitor having a negative terminal coupled to the second negative input terminal;

a first stacking switch coupled between a negative terminal of the first integration capacitor and a node for a common-mode voltage; and a second stacking switch coupled between a positive terminal of the second integration capacitor and the node for the common-mode voltage.

15. The noise-shaping successive-approximation-register analog-to-digital converter of claim 14, further comprising:

a plurality of integration switches configured to couple both the positive terminal of the first integration capacitor and the positive terminal of the second integration capacitor to the positive output terminal during an integration phase, the plurality of integration switches being further configured during the integration phase to couple the both the negative terminal of the first integration capacitor and the negative terminal of the second integration capacitor to the negative output terminal.

16. The noise-shaping successive-approximation-register analog-to-digital converter of claim 15, wherein the plurality of integration switches comprises:

a first integration switch coupled between the negative terminal of the first integration capacitor and the negative output terminal;

a second integration switch coupled between the positive terminal of the first integration capacitor and the positive output terminal;

a third integration switch coupled between the negative
       terminal of the second integration capacitor and the
       negative output terminal; and
    a fourth integration switch coupled between the positive
       terminal of the second integration capacitor and the
       positive output terminal.

17. The noise-shaping successive-approximation-register analog-to-digital converter of claim 14, wherein a total capacitance of the capacitive digital-to-analog converter (CDAC) equals two times a CDAC capacitance, and wherein a capacitance of each of the first integration capacitor and the second integration capacitor equals the CDAC capacitance.

18. The noise-shaping successive-approximation-register analog-to-digital converter of claim 14, wherein the multi-input comparator is configured to apply a unity gain with respect to the first positive input terminal and to the second positive input terminal and to apply twice the unity gain with respect to the second positive input terminal and to the second negative input terminal.

* * * * *